United States Patent [19]
Sanderson

[11] Patent Number: 5,661,369
[45] Date of Patent: Aug. 26, 1997

[54] CHARGED PARTICLE GENERATION WITH A RESONANT ELECTRICAL CIRCUIT

[75] Inventor: Allan Sanderson, Duxford, United Kingdom

[73] Assignee: The Welding Institute, Cambridge, England

[21] Appl. No.: 256,758

[22] PCT Filed: Nov. 19, 1993

[86] PCT No.: PCT/GB93/02376

§ 371 Date: Jul. 22, 1994

§ 102(e) Date: Jul. 22, 1994

[87] PCT Pub. No.: WO94/13006

PCT Pub. Date: Jun. 9, 1994

[30] Foreign Application Priority Data

Nov. 24, 1992 [GB] United Kingdom ............... 9224602

[51] Int. Cl.$^6$ .................................................. H01J 27/02
[52] U.S. Cl. .................... 315/105; 315/244; 315/5.41; 250/423 R; 313/337; 313/569; 219/121.27
[58] Field of Search ............... 315/5.41, 94, 105, 315/111.21, 219, 244, 344; 250/423 R; 313/309, 310, 336, 337, 351, 359.1, 363.1, 495, 496, 523, 569, 608; 219/121.27; 72/2, 73, 74

[56] References Cited

U.S. PATENT DOCUMENTS

| | | | |
|---|---|---|---|
| 3,218,508 | 11/1965 | Holce | 315/105 |
| 3,760,279 | 9/1973 | Rudolph | 315/107 X |
| 3,909,663 | 9/1975 | Thomas et al. | 219/121.34 X |
| 4,020,318 | 4/1977 | Sanderson | 219/121.27 |
| 4,422,013 | 12/1983 | Turchi et al. | 313/359.1 X |
| 4,489,254 | 12/1984 | Koinuma et al. | 315/39.51 |
| 4,772,823 | 9/1988 | Matsuzaki et al. | 315/39.51 |
| 5,302,881 | 4/1994 | O'Loughlin | 315/111.21 |

FOREIGN PATENT DOCUMENTS

| | | |
|---|---|---|
| 3333768A1 | 3/1984 | Germany . |
| 1549127 | 7/1979 | United Kingdom . |

Primary Examiner—Benny T. Lee
Assistant Examiner—Justin P. Bettendorf
Attorney, Agent, or Firm—Martin M. Novack

[57] ABSTRACT

Apparatus for generating a stream of charged particles, for example for use in an electron beam welding device. The apparatus includes a charged particle source (5) such as a filament and a target (6). The charged particle source (5) is connected in series with a resonant electrical circuit and the target is connected in parallel with the circuit. The source and target (5,6) are relatively juxtaposed such that under working conditions, when the circuit is in resonance, electric current passing through the source (5) causes emission of first charged particles and the potential difference between the source (5) and the target (6) accelerates the first charged particles towards the target.

30 Claims, 8 Drawing Sheets

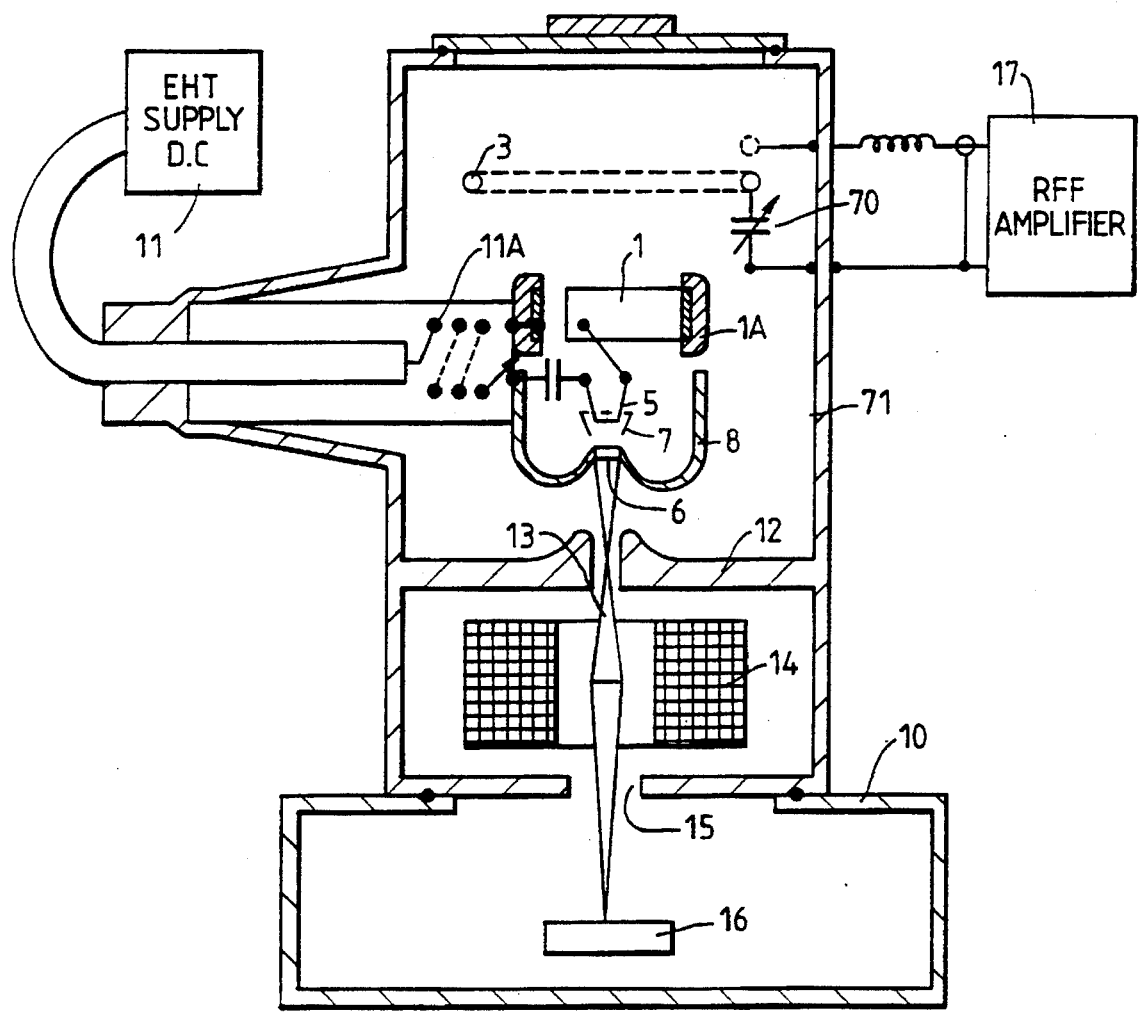

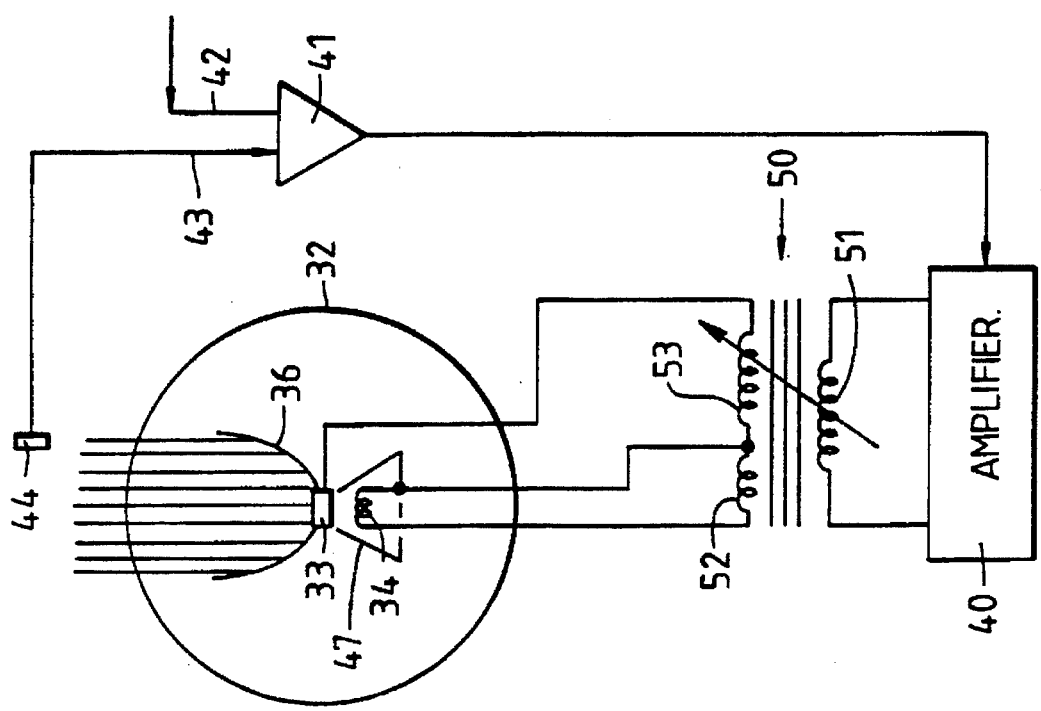
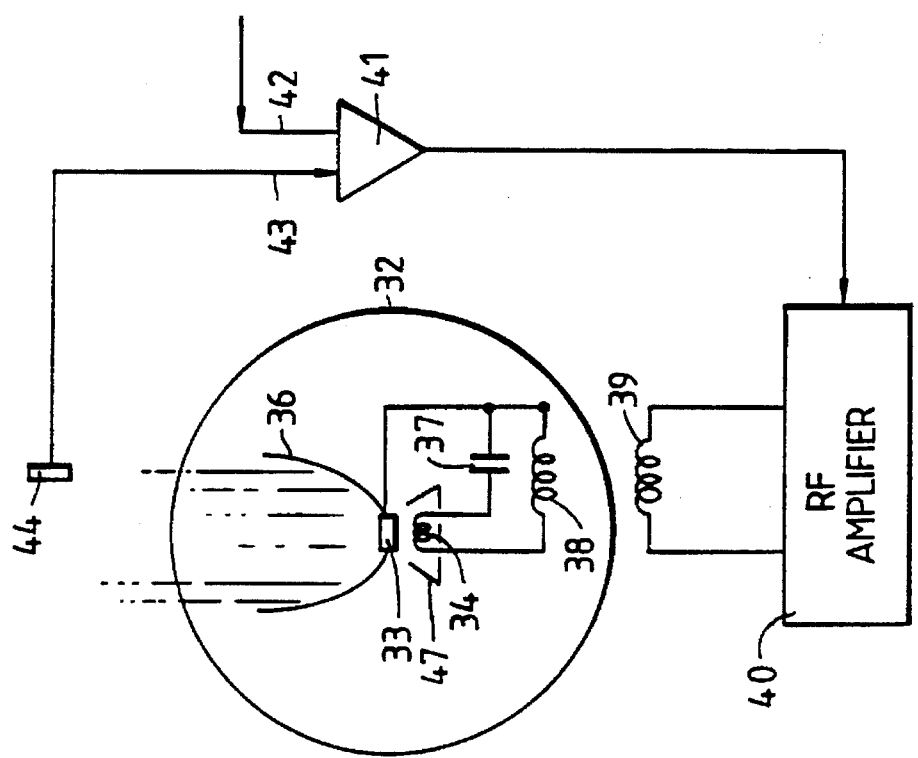
Fig.9(C)
Fig.9(B)

CHARGED PARTICLE GENERATION WITH A RESONANT ELECTRICAL CIRCUIT

FIELD OF THE INVENTION

The invention relates to apparatus for generating a stream of charged particles for use, for example, for heating in generating a stream of electrons in electron beam welding apparatus or streams of ions for use in other applications.

BACKGROUND OF THE INVENTION

In electron beam welding, an electron gun produces from a heated cathode a stream of electrons which is accelerated and focused onto a workpiece. Electron beam welding is extremely advantageous where deep penetration and a narrow heat-affected zone are required but a suitable electron beam generator requires a very high accelerating voltage, typically 150 kV is used. In U.S. Pat. No. 4,020,318 describe an electron beam generating system in which the auxiliary supply for as least one electrode of the electron gun (for example the filament or biassing electrode) is provided by a high frequency oscillator connected to a tansformer or other coupling means, the output of which is applied as the electron beam gun column to a component which is itself connected to the received output of the high voltage generator. The advantage of this arrangement is that it dispenses with the superimposition of the auxiliary supply on the HT (High Tension) voltage at a remote high voltage generator and with the corresponding auxiliary supply conductor in the conventional high voltage cable between the high voltage generator and the electron beam gun column. This system has worked well for filament and bias supplies for a simple triode gun but the control of the system for an indirectly heated or "back-bombardment" type of gun is complex.

In a back-bombardment system, the filament generates a stream of electrons which are accelerated onto a target (cathode) which is thereby heated and energised to generate its own stream of electrons which is then accelerated though an anode onto the workpiece. In order to control the system, it is first necessary to set up the back-bombardment system. This involves causing current to flow through the filament and then to monitor the electron flow to the target (which is held at a positive voltage of the order of 1 kV relative to the filament) until the correct operating filament emission current is reached. The procedure is known as "peaking" the filament. Thereafter, the main beam current from the target cathode to the workpiece must be optimized by adjusting the back bombardment accelerating voltage onto the target. Not only must this process be carried out at start-up, but also during use since the filament itself will gradually thin necessitating adjustment of the filament current to avoid filament overheating and failure of the primary filament.

SUMMARY OF THE INVENTION

In accordance with one aspect of the present invention, apparatus for generating a stream of charged particles comprises a charged particle source and a target connected respectively in series with and parallel to a resonant electrical circuit and relatively juxtaposed such that under working conditions, when the circuit is in resonance, electric current passing through the source causes emission of first charged particles and the potential difference between the source and the target accelerates the first charged particles towards the target.

This invention provides a novel arrangement in which the source and target are provided within the same resonant circuit and this has the effect of providing a self-limiting system. That is, when the current in the source circuit reaches a sufficient level to cause the source to emit the first charged particles, the associated emission current loads the target circuit leading to a limiting effect whereby with increasing power supplied to the whole circuit, the rapidly increasing charged particle emission current causes a loading of the resonant circuit whereby neither the filament current nor the accelerating voltage between the source and target increase as would otherwise be the case. As will be appreciated, the invention uses the inherent effect of a series resonant circuit to provide the high current required by the source to emit charged particles and the large potential difference which exists across a parallel resonant circuit to provide the accelerating voltage.

Preferably, the resonant circuit includes a single capacitance and a single inductor. This provides a very simple construction while at the same time permitting the use of the inductor to enable electrical power to be coupled into the resonant circuit if the inductor forms the secondary of a transformer. Typically, the emission between the source and target is in parallel with the capacitor and the inductor of the resonant circuit.

Conveniently, at a sufficiently high frequency the inductor comprises a single turn which again simplifies construction.

Where a compact equipment arrangement is required such as in the case of an electron beam apparatus, the resonant circuit preferably resonates at RF such as over 1 MHz but in other applications, where space is not at a premium for example when applied to light bulbs, the resonating circuit will resonate at much lower frequencies, for example down to 50 kHz.

The invention is particularly applicable for use with the back-bombardment supply of an electron beam gun, the target comprising the cathode of a main beam supply. Thus, the target itself will generate second charged particles in response to bombardment by the first charged particles. The second charged particles will typically be of the same type as the first charged particles (usually electrons) but could be of a different type, for example ions.

In other applications, the target could comprise a component to be heated or to be welded.

The principle of the first aspect of the invention can be extended to apparatus according to a second aspect of the invention for generating a stream of charged particles, the apparatus comprising a pair of resonant circuits, a first of which has a source of first charged particles connected in series and the second of which has a target connected in parallel, wherein parts of the first and second resonant circuits are in common, and wherein the source and target are relatively juxtaposed such that under working conditions, when the circuits are in resonance, electric current passing through the source causes emission of first charged particles and the potential difference between the source and the target accelerates the first charged particles towards the target.

This configuration provides an alternative to that of the first aspect of the invention which may be easier to implement practically in certain situations.

Typically, the parts of the two circuits which are formed in common comprise an inductance.

In both aspects, the source typically comprises a filament.

Either aspect of the invention may be applied to operation of a diode electron gun in which one circuit concerns the heating of the diode cathode and another circuit concerns the accelerating voltage between its cathode and anode target, both circuits being derived from a common radio frequency supply via resonant circuits. In particular, one resonant circuit is designed as a series inductance/capacitance system, thus resulting in a low impedance and hence substantial current flow at the resonant frequency. This is utilised for heating the primary filament of the diode gun. The other resonant circuit is designed as a parallel resonator resulting in a relatively high impedance and associated output voltage. This alternating potential is utilised as the accelerating voltage of the diode gun.

With increase in the RF supply at the appropriate common resonant frequency of the two resonant circuits, both the filament heating and accelerating voltage increase. At a sufficient power level there is emission from the heated filament and the associated current drawn by the diode gun loads the resonant circuits. This leads to a limiting effect whereby with increasing RF supply the rapidly increasing corresponding electron emission current causes a reduction in both the primary filament current and the accelerating voltage from that otherwise available and hence to a degree limits the build up to maximum power developed in the diode gun (product of electron current and accelerating voltage).

In both aspects of the invention the circuit or circuits may be operated remotely, that is without direct electrical connections, via a "vacuum" cored transformer taking advantage of the RF supply. For example, in application to the electron beam diode back-bombardment gun, the latter itself may be set at a high potential (for example, more than 100 kV negative with respect to ground) and both its filament and accelerating voltage derived via local resonant circuits tuned to a common RF supply. It is convenient for the "vacuum" core transformer to be in the form of a single turn primary (or an appropriate number of turns) with a secondary containing one or more resonant circuits which may also be configured to serve as a guard or stress reducing surface with respect to the potential difference. Hence the tendency for corona discharge and flashover is reduced between the primary and secondary of the vacuum-cored transformer, and also between the diode gun at elevated potential and its surroundings which may be at ground potential.

Thus for example, in the case of the second aspect of the invention, the RF supply may be applied to a single turn coil (one end of which can be at ground potential) and the inductive elements of the resonant circuits may each comprise a single turn in the form of a toroid or annulus with a radial gap, which circuits may be at elevated potential. Furthermore, the series resonance circuit may comprise two such single turn split rings, with the series capacitor therebetween, with appropriate connections from two electrically opposing ends of the two rings being taken to feed the filament circuit, either directly or via a further vacuum core transformer if desired. Thus in the latter case, one resonant circuit comprises the two inductive rings and associated series capacitance which, together with the second vacuum core transformer, supplies current directly to the filament.

Alternatively the inductive elements of the series resonant circuit may comprise two half rings with the series capacitor between one adjoining pair of ends, and the filament connections taken to the other pair of ends.

In addition, one of the inductive elements may itself have a further capacitance in parallel to tune it for parallel resonance at the same frequency as the RF supply. A connection between this parallel resonant circuit and the anode target provides the accelerating voltage for the diode gun with respect to the primary filament circuit.

It should be noted that both the series and parallel resonant circuits provide an alternating supply of which the former is utilised for heating the primary filament However, for the anode target only the positive half of the waves (with respect to the filament cathode) of the alternating voltage developed by the parallel resonant circuit are effective in drawing emission electron current from the heated primary filament.

It should also be noted that if the target is excessively heated (so that current flows between the target and the primary filament on the negative half of the waves with respect to the filament of the voltage developed by the parallel circuit), then this constitutes a further loading of the resonant circuits. This further loading also limits the rate of rise of the primary filament current but causes additional heating of the filament emission surface by electron bombardment from the target. In order to avoid "run away" heating the target material combination needs to be carefully selected.

In both aspects of the invention, the target electrode may be utilised as a source of particle emission in a further particle accelerating device. For example, the target electrode may serve as a cathode to a further electron beam system. It is convenient to construct such a target electrode of more than one material, where the target with respect to the primary filament has a higher melting point and/or lower electron emission property than the material from which the further particle emission is desired. Thus, for example, the target electrode may be of tantalum (which has a relative higher work function, lower emission characteristic) with a lanthanum hexaboride (which has a higher emission characteristic) insert facing away from the primary filament of the diode back bombardment gun, the lanthanum hexaboride being utilised as a heated cathode in a further diode or triode electron gun system.

The resonant systems described are particularly suitable for providing a so-called back-bombardment supply (comprising a primary filament and anode target) which in turn heats the cathode assembly of a main electron beam system. This main electron beam system may be used for yet a further electronic or particle device or for direct application such as in metal melting, evaporation, or welding as appropriate and for such applications may itself comprise a diode gun with associated cathode shield (or a triode gun with bias cup electrode) and hollow anode (which is usually maintained at ground potential). The power developed in the back-bombardment gun is typically of the order of 100 W (but according to the application may extend for example from 30–500 W), whereas that in the main electron beam system may extend upwards of 10 kW or even upwards of 100 kW. The advantage of the RF supply for a compound load such as the back-bombardment gun operated from resonant circuits is that only a single RF input is required, which may be fed independently to the vicinity of the back-bombardment gun from a separate RF source. It is noted that where the back bombardment gun is maintained at an elevated potential by for example the high voltage d.c. of the main particle beam system, it is convenient to add an RF choke in the high voltage d.c. supply so that the latter does not excessively load the RF system. Depending on the application other methods of coupling the RF supply with respect to the high potential connections may be utilised.

In accordance with a third aspect of the present invention, apparatus for generating a stream of charged particles comprises a charged particle source and a target connected in respective electrical circuits, each circuit including a respective secondary coil or antenna of a common transformer having a primary coil or antenna loosely coupled to each secondary coil or antenna, the source and target being relatively juxtaposed such that under working conditions, electric current induced in the circuit including the charged particle source causes the source to emit first charged particles and the potential difference between the source and the target accelerates the first charged particles towards the target.

This aspect of the invention takes advantage of the self-limiting or self-compensating effects described above by linking the source and target via a respective secondary coil or antenna to a common primary coil or antenna of a loosely coupled transformer. In this case, the circuits do not necessarily comprise resonant circuits.

Apparatus according to the third aspect of the invention is particularly suitable for use with electron beam devices and the description above, where appropriate, applies also to this aspect of the invention.

The third aspect of the invention is also particularly suited for use with light bulbs which rely on a back bombardment supply since the transformer can be mounted remote from the light bulb itself. Examples of applications include film projector bulbs, search light bulbs and bulbs for light houses and the like.

Some examples of electron beam apparatus according to the invention will now be described with reference to the accompanying drawings, in which:

BRIEF DESCRIPTION OF THE DRAWINGS

FIG. 2 is a schematic diagram of an electron beam system incorporating the FIG. 1 circuit;

DETAILED DESCRIPTION

Figure 1:
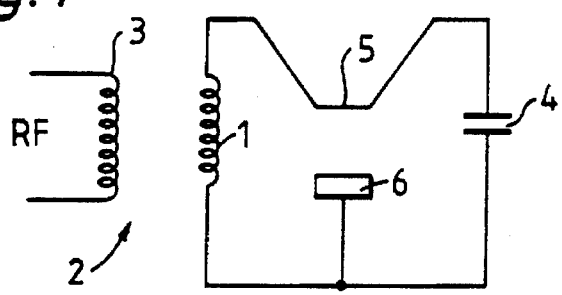
FIG. 1 is a circuit diagram showing the resonant circuit arrangement of a first example.

The resonant circuit shown in FIG. 1 comprises an inductor 1 which, in practice, will be formed of a single turn and which forms a secondary of a transformer 2 whose primary 3 is connected to an RF source. The circuit also includes a capacitor 4, the inductor 1 and capacitor 4 being connected in series with a filament 5. Connected in parallel to the circuit and physically positioned opposite the filament 5 is a target 6.

The inductor 1 and capacitor 4 are chosen such that the circuit resonates at RF such that when the circuit is in resonance, a relatively high alternating current flows through the circuit and through the filament 5 causing the filament 5 to heat up and emit electrons. At the same time, an alternating high potential difference is automatically set up between the filament 5 and the target 6 whereby the emitted electrons are accelerated onto the target 6 for the half waves where it is positive. This "intermittent current" of emitted electrons passing from the filament 5 through vacuum to the target 6 effectively detunes the resonant circuit and thus causes the filament current in the circuit to be less than otherwise would occur thereby (self) limiting the target current which passes.

For example, for a single loop coil and a resonant frequency of say 84 MHz, the capacitor 4 may have a nominal capacitance of 20 pF and the inductor 1 an inductance of 0.18 μH for resonance. In practice the capacitance would need to be trimmed when the circuit was mounted to the remainder of an electron beam generator.

FIG. 2 illustrates an electron beam system incorporating the circuit shown in FIG. 1 as a back-bombardment supply. In this case, the electron beam system is housed within a vacuum chamber 10 although the invention is equally applicable to non-vacuum based systems. A DC HT supply 11 is connected in a conventional manner to the target 6 via an inductor 11A and to a hollow anode This provides the accelerating voltage for electrons emitted by the target 6 acting as a cathode relative to the hollow anode 12. This main electron beam 13 passes through the anode 12 into a focusing region defined by a focusing coil 14 which then focuses the beam through an aperture 15 onto a workpiece 16 in a conventional manner.

The target 6 is caused to emit electrons by back-bombardment heating from the filament 5. The filament 5 and the target 6 are connected in a resonant circuit as shown in FIG. 1, the inductor 1 being defined by a single circular strip of copper which is supplemented by suitable rounded conducting material to act as a corona guard ring 1A when the filament 5 is of a significantly different potential from the surrounding structures. For example, the guard ring may be formed of non-magnetic stainless steel with a circular copper strip inserted. In addition, electron emission from filament 5 is directed preferentially towards target 6 by the shield 7 which surrounds parts of the filament from which emission is not desired.

RF power is coupled into the inductor 1 by a single turn primary 3 coupled to an RF generator 17.

Typically, the target 6 is formed of tantalum with a lanthanum hexaboride (LaB6) insert facing away from the filament. Normally, the LaB6 will be fully protected from the filament by a tantalum wall. In a modification, however, a small hole e.g. 0.25–0.5 mm diameter, is purposely inserted in the back face of the tantalum cathode, which permits heating by the primary filament emission, thus increasing the turn-on response of the main beam gun, but yet limits the reverse emission in the primary gun preventing "run away".

Figure 3:
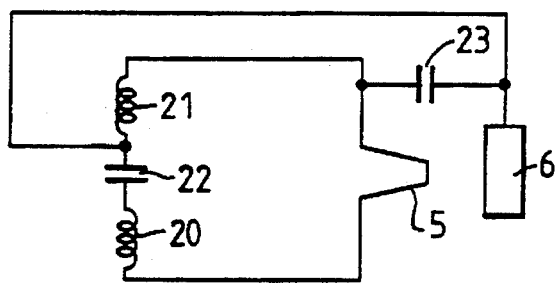
FIG. 3 is a circuit diagram of a second example.

FIG. 3 illustrates a second type of circuit which comprises a pair of resonant circuits. The first resonant circuit comprises inductors 20, 21, a capacitor 22 and a filament 5 connected in series. The second resonant circuit comprises the inductor 21 and a capacitor 23 with the target 6 connected in parallel and physically positioned opposite the filament 5.

Figure 4A:
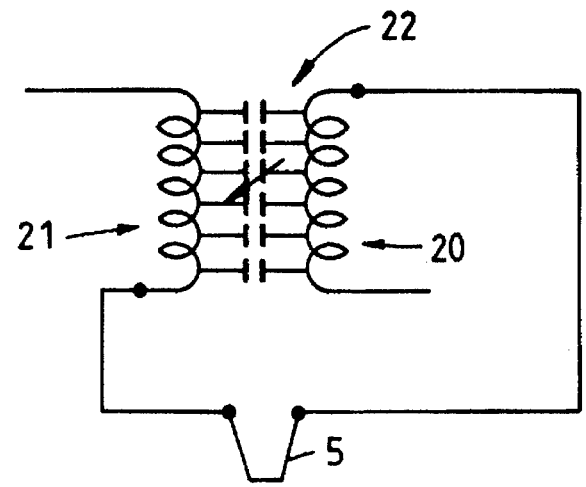
FIGS. 4A–4C illustrate different practical configurations of the FIG. 3 example.

FIG. 4 illustrates different configurations for the first resonant circuit incorporating the filament 5. In FIG. 4A the inductors 20, 21 and capacitor 22 are arranged in a distributed form. The distributed capacitance may also be supplemented by one or more lumped capacitors between appropriate parts of the inductors.

Figure 4B:
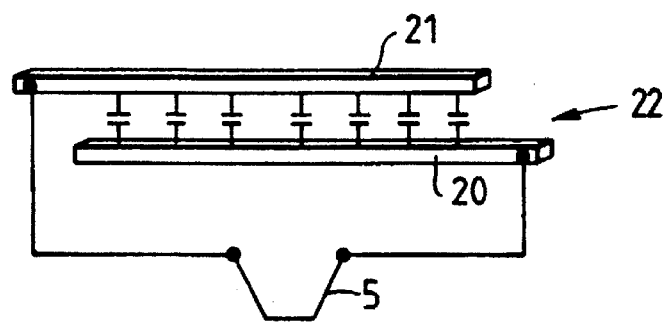

In a preferred form, the inductors 20, 21 comprise flat conductors which are relatively closely spaced, whereby the spacing provides a degree of capacitive coupling 22 between the inductors, FIG. 4B. The spacing is adjustable to provide basic tuning to the required frequency for resonance, together with one or more adjustable lumped capacitors for fine tuning.

Figure 4C:
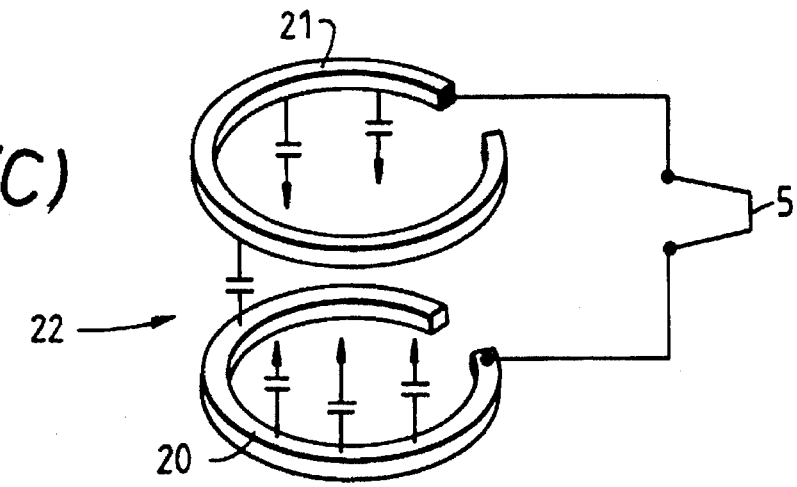

For application as in a back-bombardment gun, the inductors 20, 21 are conveniently in the form of single turn coils closely spaced, FIG. 4C. Here the coils are excited by a high frequency supply (also in the form of a single turn or low number of turns) such that the series resonant system provides a relatively high current at relatively low impedance to the load, which comprises a primary filament for the back-bombardment gun.

Figure 6A:
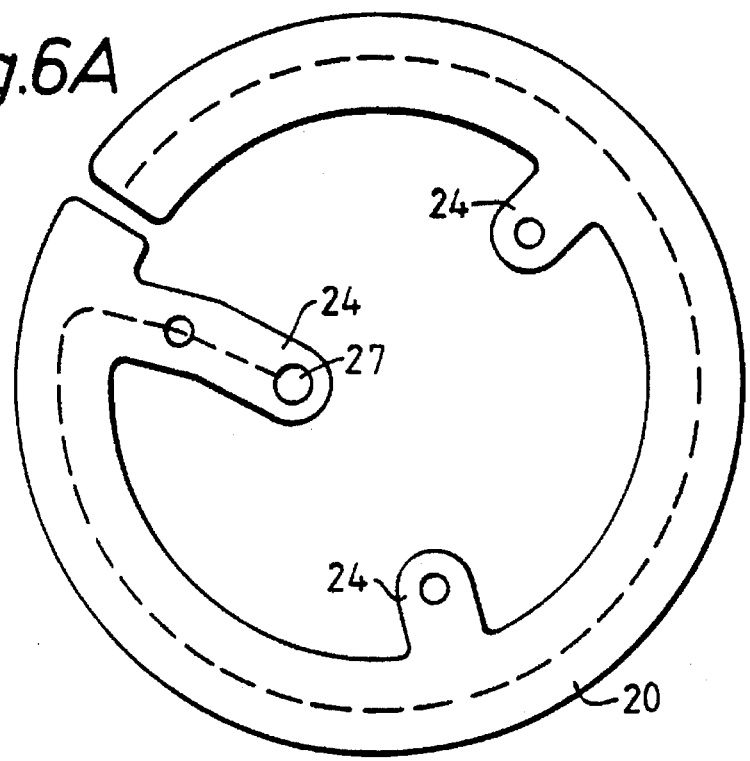
FIGS. 6A and 6B illustrate the lower and upper coils respectively of the inductor shown in FIG. 5.
Figure 6B:
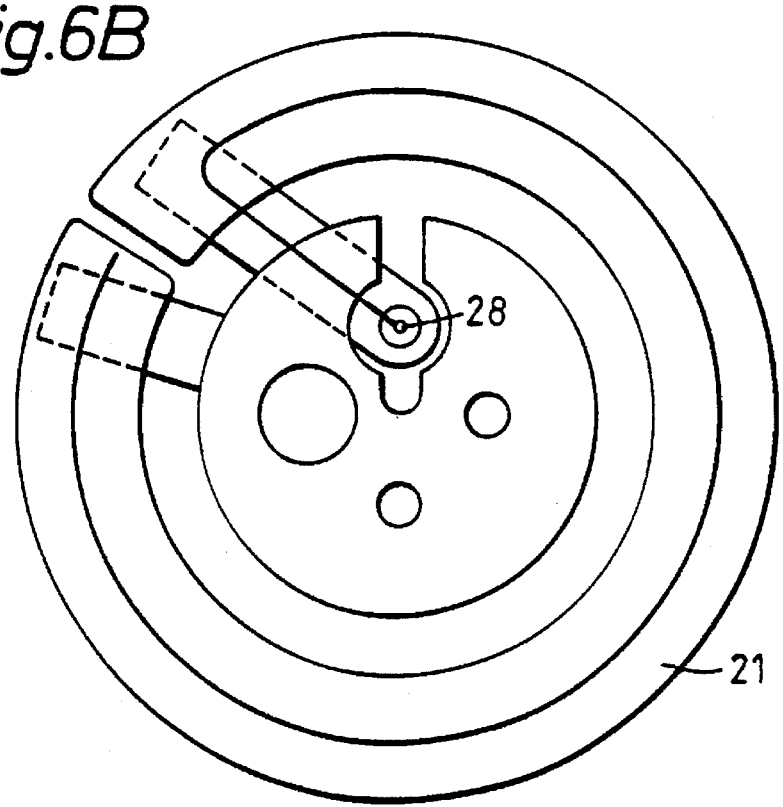

In one form the physical construction of the inductors is shown in FIGS. 6A and 6B together with the connections 27,28 to the filament which is mounted within the central region. As illustrated in FIG. 6A, the single turn inductor may also be provided with fixing lugs 24 for maintaining its position accurately with respect to the back-bombardment gun and with respect to the second inductor, FIG. 6B.

The inductors 20, 21 comprise flat strips of copper, which may be supplemented by suitably rounded conducting material to act as a corona guard ring where the filament is at a significantly different potential from the surrounding structures.

Figure 5A:
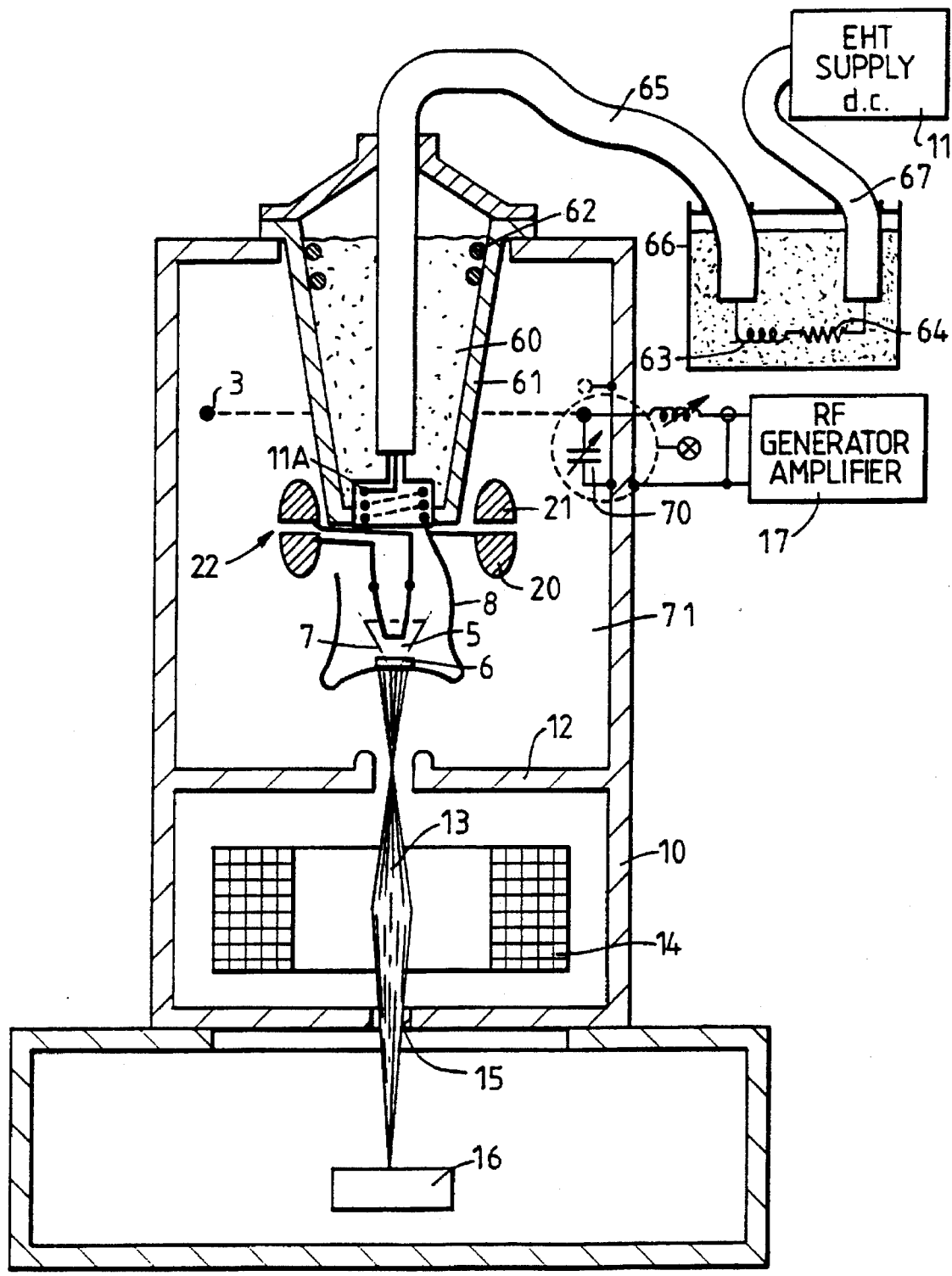
FIG. 5A illustrates an electron beam system incorporating the FIG. 3 circuit.

FIG. 5A illustrates an electron beam system incorporating the FIG. 3 circuit and this has an identical configuration to the FIG. 2 system apart from the different circuit which is used. Consequently, this resonance system will not be described again and reference is made to the description of FIG. 2.

Further details in FIG. 5A include a cooling system 60 in which the high voltage gun components and secondary RF circuit are immersed in an insulating liquid. When the liquid is heated, it convects upwards to the top of the high voltage receptacle 61 where it is then cooled by water cooling coils 62.

The technique of generating the gun supplies locally permits the possibility of inserting series impedance 63,64 into the high voltage cable line. The circuit elements 63,64 as indicated in FIG. 5A would have the effect of producing a voltage drop under gun high voltage breakdown conditions, thus tending to suppress discharging. These elements are conveniently housed in a tank containing insulating fluid. The inductor 63 would present a very high impedance to micro discharges lasting from less than a micro second to several 10s of micro seconds and the series resistor 64 would produce additional voltage drop for longer duration events. It is important to note that the HT cable 65 between the gun and the series impedance tank 66 will be short to minimize excessive stored energy in this part of the cable. Typically, the cable 67 from the tank 66 will be of significantly greater length from the EHT supply 11.

A further point to note in connection with both FIG. 2 and FIG. 5A is that the primary circuit tuning capacitor 70 is housed in the evacuated volume 71 of the welding head. This achieves a significant minimisation of the size and cost of the component. Also the ground return side of the capacitor 70 provides a convenient fine trim of the capacitance using a screw which can be operated external to the vacuum, via a rotating seal.

Figure 5B:
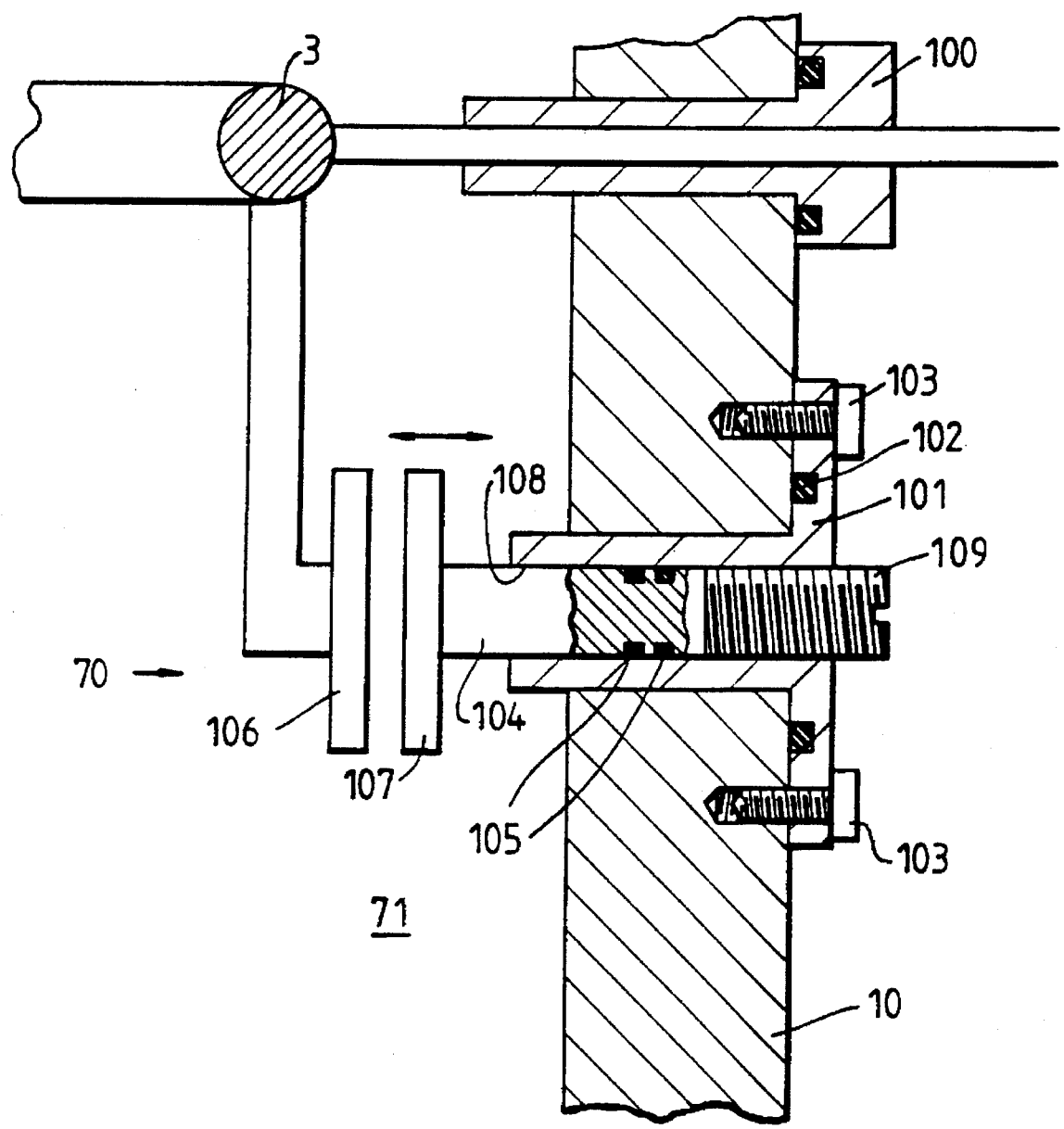
FIG. 5B illustrates the portion X in FIG. 5A after enlargement.

The portion of the system labelled X in FIG. 5A is shown in more detail in FIG. 5B. As can be seen, the lead to the RF generator amplifier 17 passes through the wall of the chamber 10 within an insulator 100. The capacitor 70 is defined by a pair of plates 106,107. The plate 106 is fixed to the primary 3 while the plate 107 is mounted to a partially screw threaded axle 104 received in a bore 108 of an insulating bushing 101. The axle 104 is sealed to the bushing 101 by a rotary vacuum seal 105. The bushing 101 is secured to the wall of the chamber 10 by bolts 103 and is sealed by a vacuum seal 102. The end of the axle 104 remote from the plate 107 is screw threaded at 109 as is the corresponding portion of the bore 108 of the bushing 101. Thus, by rotating the axle 104 using a screwdriver or the like, the plate 107 can be moved towards and away from the plate 106.

In both examples, the filament 5 will typically oscillate at a potential of about ±2 kV, about the target potential which typically may be −150 kV with respect to ground.

In the preferred embodiment, the anode target 6 is mounted on a support structure 8 which appropriately surrounds the filament 5 to prevent stray electron emission from the latter from entering into the main beam system. (See FIGS. 2 and 5). In one form the target comprises a material of high melting point with minimal emitting properties together with an insert (facing away from the filament 5) which has a relatively strong electron emitting capability. Thus, as illustrated in FIGS. 2 and 5, the back-bombardment gun comprises a filament 5 and target 6 which in turn supports the cathode of the main electron gun (in this case also a diode construction).

It should be noted that the target 6 is connected to a separate d.c. supply 11 which provides the high voltage between the target, which is the cathode of the main electron beam system, and its associated hollow anode plate 12. Sufficient insulation is maintained between the filament 5 and the target 6 by the vacuum environment of the back-bombardment system, together with sufficient protection against corona or other unwanted discharge between the back-bombardment assembly and the surrounding structure, which are at comparatively high potential difference (for example in excess of 100 kV). An inductor 11A is provided in series with the high voltage d.c. supply 11 to prevent excess loss of the RF into the high voltage supply source and its associated connecting leads. This radio frequency choke is preferably not tuned but offers a broad band impedance to this resonant frequency of the resonant circuits.

It should be noted that the high voltage stress distribution from the components at high potential is modified by the presence of the single turn resonant frequency excitation coil supply, as well as by the surrounding structure. It is particularly convenient to position the single turn supply 3 so as to avoid excess stress concentrations in the distribution of the equipotential between the components at high potential and the structure at ground potential, as shown in FIGS. 2 and 5.

The emitting side of the target 6, is utilised as a cathode in the main electron beam system together with a cathode shield cup, and is so shaped that the main electron stream is partially focused as it progresses towards the aperture in the anode plate. This partial focusing or cross-over leads to an expanding electron beam beyond the hollow anode which is brought to an operating focus in the vicinity of the workpiece 16 by the main focus coil 14.

With the resonant circuit approach of the invention it has been found that the geometry and dimensions of the back-bombardment stage are relatively uncritical. Pot example, with a large spacing between primary filament and anode target, a relatively higher voltage is required to obtain electron emission. On the other hand, with a small spacing between the primary filament and anode target, higher emission currents occur readily at lower accelerating voltages. However, the power expended in heating the target (product of accelerating voltage and emission current) is similar due to the increasing magnitude of one term compensating for the lack of magnitude in the other.

Figure 7:
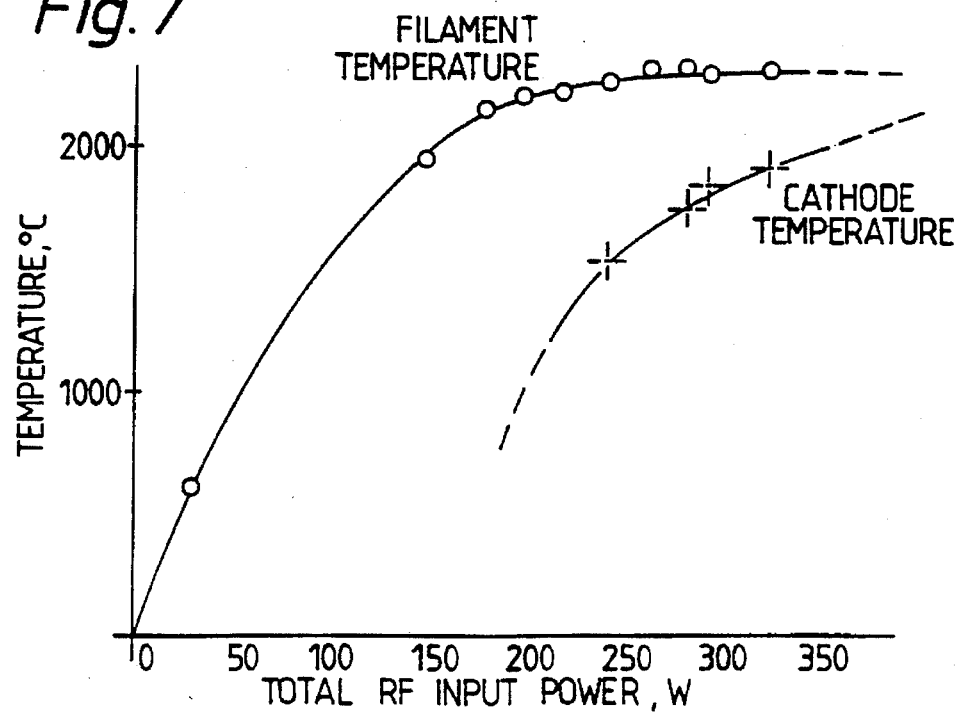
FIG. 7 illustrates the variation of temperature with total RF input power.

FIG. 7 illustrates the variation in temperature of the filament 5 and target 6 respectively with total RF input power. The self-limiting effect can readily be seen from this diagram, whereby the rate of increase in temperature with increase in input RF power falls off significantly as the resonant circuit becomes loaded.

The applications of the invention described above are all concerned with electron beam welding apparatus. The invention is also applicable in other areas, for example to provide an indirect heat source for filamentary type light sources such as a quartz halogen bulb.

Figure 8A:
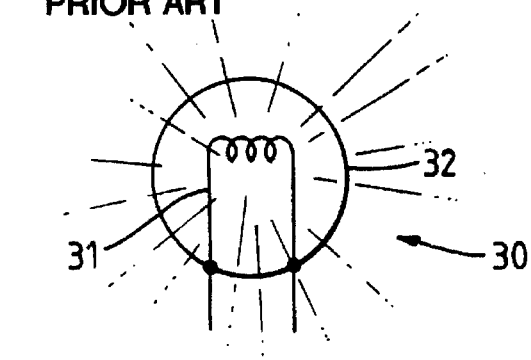
FIGS. 8A and 8B illustrate conventionally directly and indirectly heated light bulbs respectively; and, FIGS. 9A, 9B and 9C illustrate examples of light bulbs heated indirectly by apparatus according to the invention.
Figure 8B:
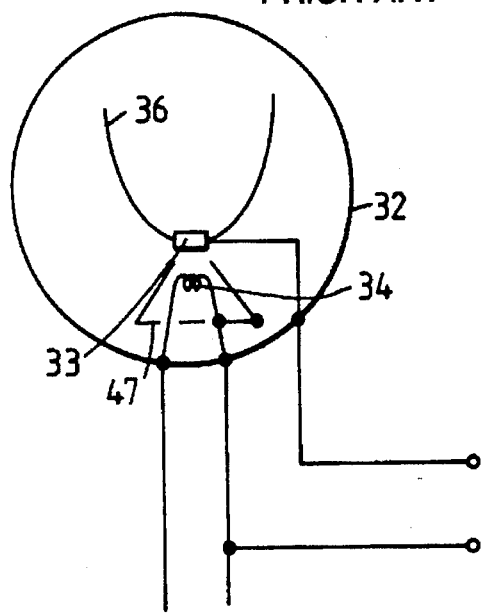

FIG. 8A illustrates a conventional light source such as a quartz halogen bulb 30 comprising a coil of tungsten wire 31 positioned within a glass envelope 32. This provides a bright light of repeatable power, but because the filament geometry is complex, the light is scattered in all directions, making it extremely difficult to refocus into a collimated or focused beam over long distances. Advantage can be gained by employing an indirectly heated incandescent bulb of which a known example is shown in FIG. 8B. In this case, the light source comprises a rigid and precisely made relatively thick circular disc 33 which is heated from the rear by an electron beam generated from a filament 34. Conventionally, such an indirectly heated light source would require a high current supply for the filament 34 and a separate high voltage supply 35 for the electron accelerating stage. Both supplies would need to be precisely regulated to avoid over-heating of the filament or the main target 33. Indeed, it is likely that there would be a tendency for the primary filament 34 to thin with use which would result in premature failure if the filament current was maintained constant. A reflector 36 extends around the target source 33 to focus the resulting beam. In addition, a shield 47 surrounds part of the filament 34 to restrict emission to the desired zone.

Figure 9A:
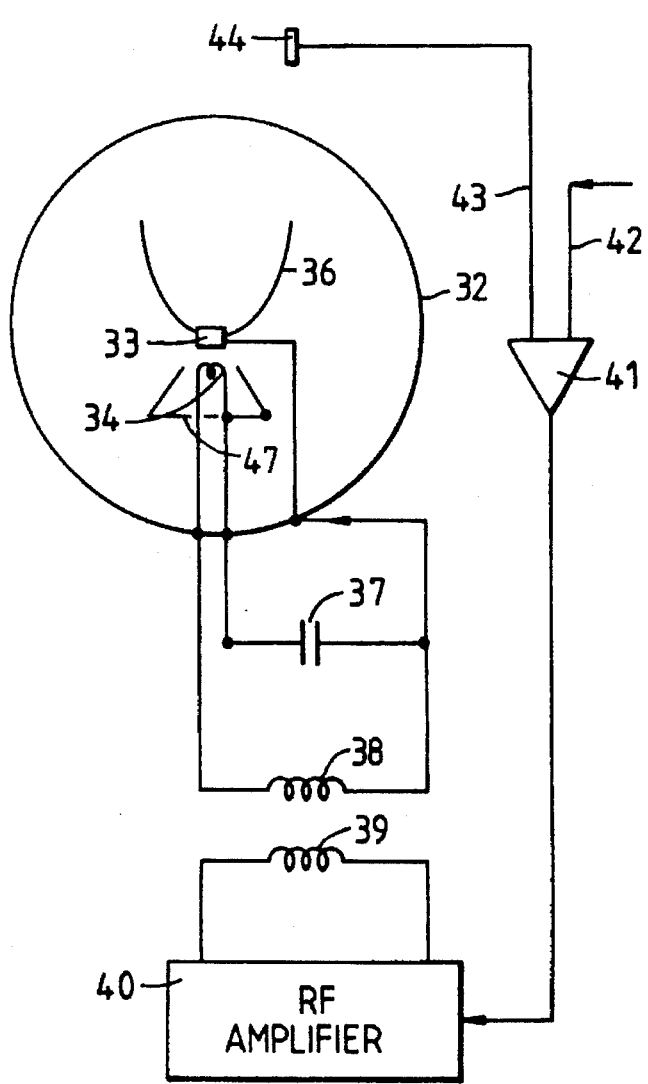

FIG. 9A illustrates a light source similar to the source shown in FIG. 8B but which is energised by an example of apparatus according to the invention. As can be seen, the filament 34 is connected in series with a capacitor 37 and inductor 38 while the target 33 is connected in parallel with the resonant circuit. The arrangement is thus similar to that shown in FIG. 1. Current is induced in the inductor 38 via a primary coil 39 connected to a RF amplifier 40. The RF amplifier 40 is controlled via a comparator 41 to one input of which is fed a reference light intensity level 42 and to the other input of which is fed a monitored light intensity level 43 from a light level sensor 44.

As can be seen, the resonant circuit only requires one input to be controlled which is achieved by monitoring the light intensity produced by the main target 33 and by using this as a feed back signal.

FIG. 9B illustrates a modification of the FIG. 9A example in which the resonant circuit is positioned within the glass envelope 32. Depending on the size of the glass envelope and reflector, this should be achievable in practice using a sufficiently high frequency and thus obviating the need for glass-metal seals. However, in order to achieve a compact bulb envelope containing both the capacitance 37 and inductors 38, the frequency used would need to be relatively high, typically at least of the order of 50 kHz and more likely about 10 MHz, even for a sizable bulb. For even more compact designs, frequencies in excess of 100 MHz can be used. In such cases, the inductors reduce to coils of one or two turns only as already described with respect to electron beam back-bombardment supplies.

FIG. 9C illustrates a modified light bulb arrangement which avoids the need for resonant circuits. In this case, a loosely coupled transformer 50 is provided having a primary coil 51 and a pair of secondary coils 52,53. The secondary coil 52 is coupled in a circuit with the filament 34 while the secondary coil 53 is connected to the target 33. RF power is supplied to the primary 51 and is loosely coupled into the secondary coils 52,53. The electric current induced in the circuit of the secondary coils 52 causes the filament 34 to heat up until electrons start to be emitted. This causes the target 33 to begin to act as a load on the secondary coil 53 consequently reducing the current which flows through the filament 34 and achieving the self-limiting effect required. This leads to a much longer life for the components of the bulb than has previously been possible.

An emission shield 47 is shown in FIGS. 9A to 9C which is similar to that shown for the back-bombardment arrangement in FIGS. 2 and 5.

I claim:

1. Apparatus for generating a stream of charged particles, the apparatus comprising a resonant electrical circuit; a charge particle source connected in series with said resonant electrical circuit; and a target connected to said resonant electrical circuit, said charged particle source and said target being relatively juxtaposed such that under working conditions, when the circuit is in resonance, electric current passing through the source causes emission of first charged particles and the potential difference produced by said resonant electrical circuit between the source and the target accelerates the first charged particles toward the target in parallel with said resonant electrical circuit.

2. Apparatus according to claim 1, wherein the resonant circuit includes a single capacitance and a single inductor.

3. Apparatus according to claim 2, wherein the inductor comprises a single turn.

4. Apparatus according to claim 1, wherein the resonant circuit resonates at a radio frequency.

5. Apparatus according to claim 1, wherein the target generates second charged particles in response to bombardment by the first changed particles.

6. Apparatus according to claim 5, wherein the second charged particles comprise electrons.

7. Apparatus according to claim 1, wherein the source comprises a filament.

8. Apparatus according to claim 1, wherein the target comprises a source of further charged particles.

9. Apparatus according to claim 1, wherein the target includes a hole facing towards the source.

10. Apparatus according to claim 1, wherein said resonant circuit is powered remotely via a transformer.

11. Apparatus for generating a stream of charged particles, the apparatus comprising a pair of resonant circuits, a first of which has a source of first charged particles connected in series and the second of which has a target connected in parallel, wherein parts of the first and second resonant circuits are in common, and wherein the source and target are relatively juxtaposed such that under working conditions, when the circuits are in resonance, electric current passing through the source causes emission of first charged particles and the potential difference between the source and the target accelerates the first charged particles towards the target.

12. Apparatus according to claim 11, wherein the parts of the two circuits which are formed in common comprise an inductance.

13. Apparatus according to claim 11, wherein the target comprises a source of further charged particles.

14. Apparatus according to claim 11, wherein the target includes a hole facing towards the source.

15. Apparatus according to claim 11, wherein both of said resonant circuits are powered remotely by a transformer.

16. Apparatus according to claim 11, wherein the pair of circuits are energised from a common source.

17. Apparatus according to claim 11 wherein the source comprises a filament.

18. Apparatus according to claim 17, wherein the resonant circuits are powered via a single turn coil inductively coupled with the inductive elements of the resonant circuit.

19. Apparatus according to claim 18, wherein each inductive element comprises a single turn in the form of a spiral or annulus.

20. Apparatus according to any of claims 1 and 11, wherein the target is composed of more than one material.

21. Apparatus according to any of claims 1 and 11, wherein the target is composed of more than one material and wherein one material of the target faces the source and is of a relatively higher work function (lower emission characteristics) such as tantalum, while the other material is of lower work function (higher emission characteristics) such as lanthanum hexaboride.

22. Apparatus for generating a stream of charged particles, the apparatus comprising a charged particle source and target connected in respective electrical circuits, each circuit including a respective secondary coil or antenna of a common transformer having a primary coil or antenna loosely coupled to each secondary coil or antenna, the source and target being relatively juxtaposed such that under working conditions, electric current induced in the circuit including the charged particle source causes the source to emit first charged particles and the potential difference between the source and the target accelerates the first charged particles towards the target, said target being composed of more than one material and one material of the target facing the source and being of a relatively higher work function (lower emission characteristics) such as tantalum, while the other material is of lower work function (higher emission characteristics) such as lanthanum hexaboride.

23. A particle accelerating device including apparatus for generating a stream of charged particles, the apparatus comprising a charged particle source and a target connected respectively in series with and parallel to a resonant electrical circuit and relatively juxtaposed such that under working conditions, when the circuit is in resonance, electric current passing through the source causes emission of first charged particles and the potential difference between the source and the target accelerates the first charged particles towards the target, wherein the target comprises a source of charged particles, the device further including means for accelerating said particles generated by said target.

24. A device according to claim 23, wherein the device comprises an electron beam generator.

25. Electron beam welding apparatus including apparatus according to claim 24.

26. A particle accelerating device including apparatus for generating a stream of charged particles, the apparatus comprising a pair of resonant circuits, a first of which has a source of first charged particles connected in series and the second of which has a target connected in parallel, wherein parts of the first and second resonant circuits are in common, and wherein the source and target are relatively juxtaposed such that under working conditions, when the circuits are in resonance, electric current passing through the source causes emission of first charged particles and the potential difference between the source and the target accelerates the first charged particles towards the target, wherein the target electrode comprises a source of charged particles, the device further including means for accelerating the particles.

27. A device according to claim 26, wherein the device comprises an electron beam generator.

28. A particle accelerating device including apparatus for generating a stream of charged particles, the apparatus comprising a charged particle source and a target connected in respective electrical circuits, each circuit including a respective secondary coil or antenna of a common transformer having a primary coil or antenna loosely coupled to each secondary coil or antenna, the source and target being relatively juxtaposed such that under working conditions, electric current induced in the circuit including the charged particle source causes the source to emit first charged particles and the potential difference between the source and the target accelerates the first charged particles towards the target, wherin the target defines a source of changed particles, the device further including means for accelerating the particles.

29. Apparatus according to claim 28, wherein said electrical circuits are energized from a common source.

30. A device according to claim 28, wherein the device comprises an electron beam generator.

* * * * *